United States Patent
Gilliland et al.

(10) Patent No.: US 7,466,562 B2
(45) Date of Patent: Dec. 16, 2008

(54) TOOLLESS METHOD FOR ALIGNMENT, RETENTION, CONNECTION, TERMINATION AND TEST ON PRINTED CIRCUIT BOARDS

(75) Inventors: Don A. Gilliland, Rochester, MN (US); Guy A. Thompson, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 91 days.

(21) Appl. No.: 11/458,743

(22) Filed: Jul. 20, 2006

(65) Prior Publication Data

US 2008/0019110 A1 Jan. 24, 2008

(51) Int. Cl.
*H05K 1/11* (2006.01)
*H05K 1/14* (2006.01)

(52) U.S. Cl. .................. 361/803; 361/807; 361/810

(58) Field of Classification Search ............ 361/810, 361/807, 760, 748; 174/138
See application file for complete search history.

(56) References Cited

U.S. PATENT DOCUMENTS

| | | | |
|---|---|---|---|
| 5,091,826 A | 2/1992 | Arnett et al. | |
| 5,147,219 A * | 9/1992 | Gilberts et al. | ............. 439/521 |
| 5,278,524 A | 1/1994 | Mullen | |
| 5,362,952 A | 11/1994 | Nair et al. | |
| 5,395,099 A | 3/1995 | Hall | |
| 5,396,186 A | 3/1995 | Scheutzow | |
| 5,744,948 A | 4/1998 | Swart | |
| 5,964,625 A | 10/1999 | Farley | |
| 6,404,646 B1 * | 6/2002 | Tsai et al. | ................... 361/758 |
| 6,412,546 B1 | 7/2002 | Lin et al. | |
| 6,442,045 B1 | 8/2002 | Goodwin et al. | |
| 6,443,759 B1 * | 9/2002 | Matsuda et al. | ............. 439/488 |
| 6,468,114 B1 * | 10/2002 | Coret et al. | ................. 439/752 |
| 6,493,233 B1 * | 12/2002 | De Lorenzo et al. | ........ 361/752 |
| 6,542,372 B1 * | 4/2003 | Paquin et al. | ............... 361/758 |
| 6,781,055 B2 * | 8/2004 | Chen | .......................... 174/535 |
| 7,046,020 B2 * | 5/2006 | LaMeres et al. | ............. 324/754 |
| 7,227,761 B2 * | 6/2007 | Estes et al. | ................. 361/810 |
| 2004/0058566 A1 | 3/2004 | Ma | |

* cited by examiner

*Primary Examiner*—Hung S Bui
(74) *Attorney, Agent, or Firm*—Patterson & Associates

(57) ABSTRACT

Embodiments of the present invention provide a system for testing and mounting a PCB in a device. A PCB may be placed on one or more standoffs so that a head portion of the standoff protrudes from one or more apertures of the PCB. A push-pin type standoff cap may then be placed on the protruding heads to mechanically restrain the PCB to the standoffs. Furthermore, one or more cables may be coupled with the standoff caps to provide power or test signals to one or more connector pads on the PCB. Therefore, the standoff caps provide a system for aligning, retaining, connecting, terminating, and testing printed circuit boards.

18 Claims, 12 Drawing Sheets

TOOLLESS METHOD FOR ALIGNMENT, RETENTION, CONNECTION, TERMINATION AND TEST ON PRINTED CIRCUIT BOARDS

BACKGROUND OF THE INVENTION

1. Field of the Invention

The present invention is generally relates to a system for mounting and testing printed circuit boards, and more specifically a system for aligning, retaining, connecting, terminating, and testing printed circuit boards.

2. Description of the Related Art

Most electronic devices today contain one or more Printed Circuit Boards (PCB). A PCB is used to mechanically support and electrically connect components of a device using conductive pathways called traces. For example, a computer usually contains a PCB called the motherboard. The motherboard contains the essential components of the computer such as the microprocessor and main memory, along with other basic components. The components may be housed in sockets and connected to each other using the traces.

During assembly of electronic devices, one or more PCBs may be secured to each other or to a device frame or chassis. Securing the PCBs usually involves fastening the PCB to another PCB, or to the device chassis, using screws. The PCB is usually secured on one or more standoffs. Placing the PCB on a standoff ensures airflow along both surfaces of the PCB, thereby allowing cooling during operation of the device. The standoffs also prevent undesired contact between active circuits of the PCB and other device components.

FIG. 1 illustrates the mounting of a PCB 110 on a chassis 120. Chassis 120 may contain one or more standoffs 121 on which the PCB may be mounted. As illustrated, standoffs 121 may be hollow cylindrical sleeves, the inner portion of the sleeve providing threading for fastening screws. During installation, the PCB is placed on the standoffs so that one or more apertures 112 of the PCB align with the one or more standoffs 121. A screw 111 may then be passed through each of the apertures 112 and secured to the standoffs 121 by means of the threaded inner sleeves of the standoffs.

One problem with the prior art is that the PCB installation can be quite laborious and time consuming. The PCB must first be aligned with the screw holes. The screws must then be tightened while keeping the PCB aligned with the screws. Maintaining alignment makes assembly slow and inefficient.

Screw installation requires additional tools and application of force to tighten the screws which may increase the risk of damage to sensitive components of the PCB. Furthermore, the screws are usually small and may be dropped on the PCB and other components or lost in the device, thereby increasing the risk of damage even further. Because screws are made of conductive materials, there is also a danger that the screws, if dropped in the device, may create undesired short circuits.

PCBs are also routinely subject to diagnostic testing prior to installation in a device. For example, the diagnostic testing may include connectivity testing to determine operating characteristics based on response of the PCB to imposed test signals. One or more connectors are typically attached to the PCB to facilitate testing. The connectors serve to connect one or more test cables that impose test signals on the PCB under test. For example, a connector 113 is shown in FIG. 1. FIG. 2 illustrates an enlarged bottom view of a PCB with a connector 113 and a standoff 121.

One problem with using prior art connectors is that testing can be time consuming and tedious. Typically, connectors serve to connect a single coaxial test cable to the PCB in order to perform a single testing function. Thus, when performing multiple tests, testing cables must be uncoupled from original connectors and re-coupled to other connectors. Alternatively, users may couple different testing cables to the same connector to perform other tests. However, this requires on-board logic to multiplex signals. The use of connectors and/or multiplexing logic may take up valuable space on the PCB. One skilled in the art will recognize that real estate on PCBs is precious given the increasing demand for greater functionality from smaller devices.

Yet another problem, as illustrated in FIG. 2, is that connectors are typically unsupported when mounted. Thus, the use of force when coupling cables to the connectors could crack or otherwise damage the PCB. Furthermore prior art connectors remain on the PCB after testing and even after the device is commercialized. Leaving connectors on the PCB can be very costly, especially given that some connectors may even be gold plated.

Therefore, what is needed is are improved methods, systems, and apparatus for efficient and safe installation and testing of PCBs.

SUMMARY OF THE INVENTION

The present invention generally relates to a system for mounting and testing printed circuit boards, and more specifically a system for aligning, retaining, connecting, terminating, and testing printed circuit boards.

One embodiment of the invention provides a mounting device for mounting a printed circuit board (PCB). The mounting device generally comprises a standoff comprising a body and a securing element disposed in and protuding from the body, wherein the body forms a PCB resting surface at an interface of the securing element and the body and wherien the securing element is configured to be registered with and disposed through an aperature formed in the PCB. The mounting device further comprises a standoff cap comprising a hollow sleeve configured to axially receive the securing element and mechanically restrain the PCB against the PCB resting surface of the standoff, wherein an inner surface of the hollow sleeve and an outer surface of the securing element define a locking interface to resist relative axial movement.

Another embodiment of the invention provides a method for testing a PCB. The method generally comprises placing the PCB on a plurality of standoffs, each standoff comprising a body, a securing element disposed in and protruding from the body, and a PCB resting surface formed at an interface of the head and the body, wherein the securing element is narrower than the body thereby allowing each securing element to register with and be disposed through an aperture formed in the PCB and allowing the PCB to rest on the respective PCB resting surface. The method further comprises securing the PCB to the standoffs by fitting a standoff cap over a portion of each securing element protruding from the apertures, wherein one or more of the standoff caps include one or more electrically conductive elements coupled to one or more respective electric cables for carrying test signals, and registering the one or more conductive elements with one or more connector pads on the PCB surface to exchange test sigals with the PCB.

Yet another embodiment of the invention provides a device, generally comprising a plurality of standoffs connected to one of a device chassis and a device component, the standoffs each comprising a body and a securing element disposed in and protuding from the body, wherein the body forms a PCB resting surface at an interface of the securing element and the body, a PCB disposed on the respective PCB resting surface of the standoffs and wherein the PCB defines a plurality of apertures each having a respective one of the securing elements of the standoffs disposed therethrough, and a plurality of standoff caps, each comprising a hollow sleeve disposed on a portion of the securing element protruding from a respective aperture and mechanically restraining the PCB against the standoff, wherein the standoff caps are color coded, each color identifying a function of the standoff caps.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the present invention provide a system for testing and mounting a PCB in a device. A PCB may be placed on one or more standoffs so that a head portion of the standoff protrudes from one or more apertures of the PCB. A push-pin type standoff cap may then be placed on the protruding heads to mechanically restrain the PCB to the standoffs. Furthermore, one or more cables may be coupled with the standoff caps to provide power or test signals to one or more connector pads on the PCB. Therefore, the standoff caps provide a system for aligning, retaining, connecting, terminating, and testing printed circuit boards.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

PCB Alignment and Retention Device

Figure 1:
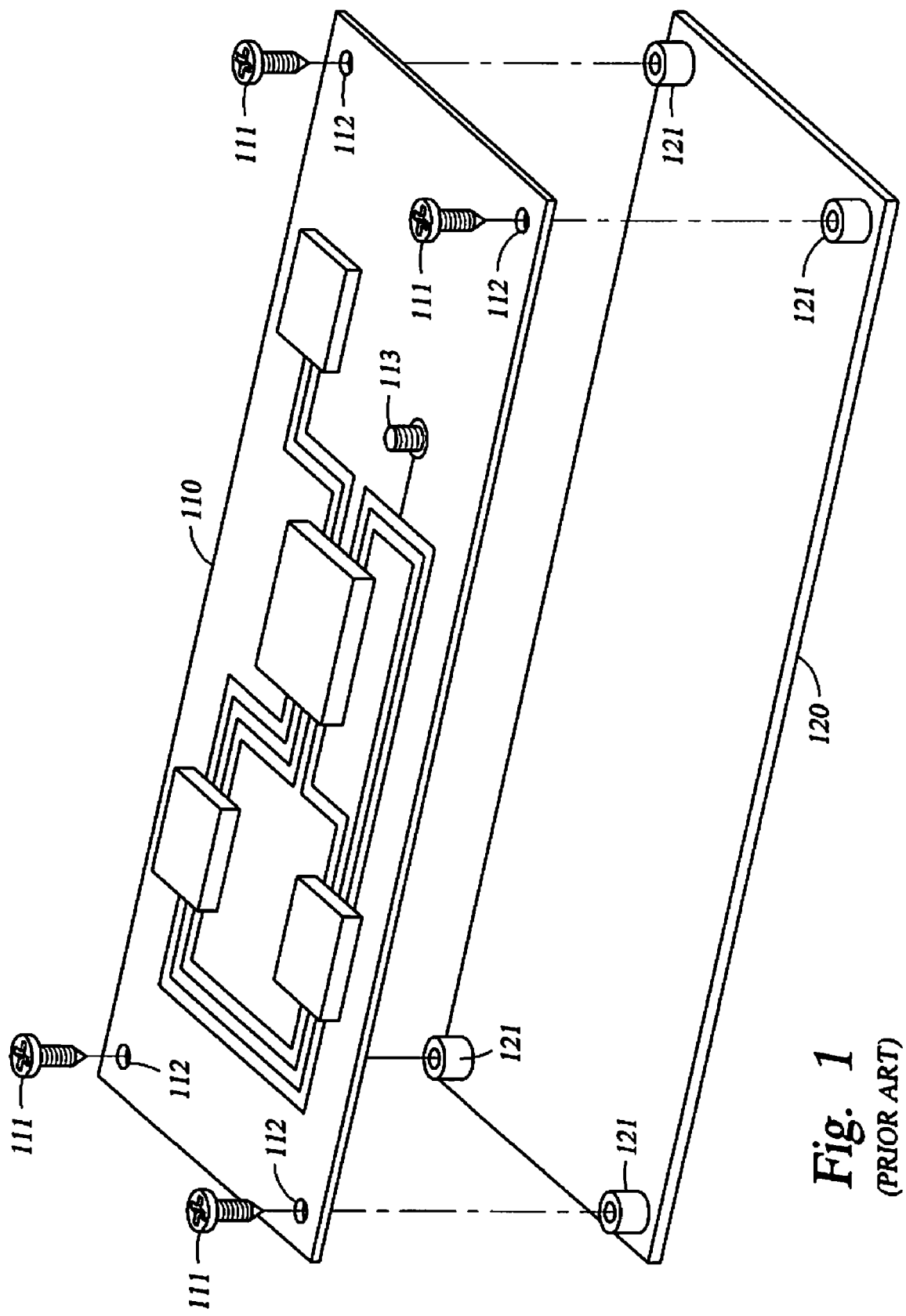
FIG. 1 is an illustration of a system for securing a PCB to a chassis according to the prior art.
Figure 2:
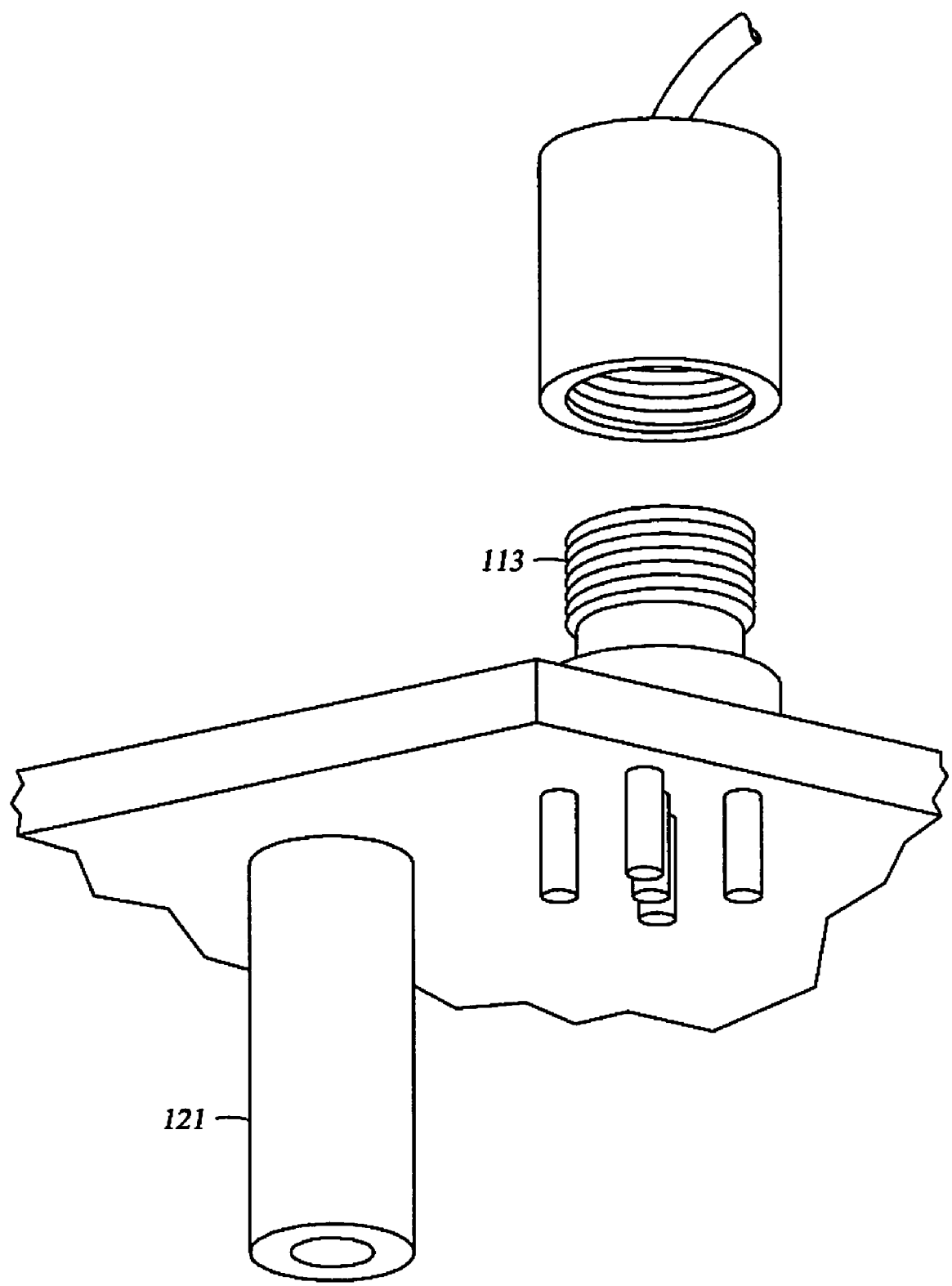
FIG. 2 is an illustration of a standoff and a connector according to the prior art.
Figure 3:
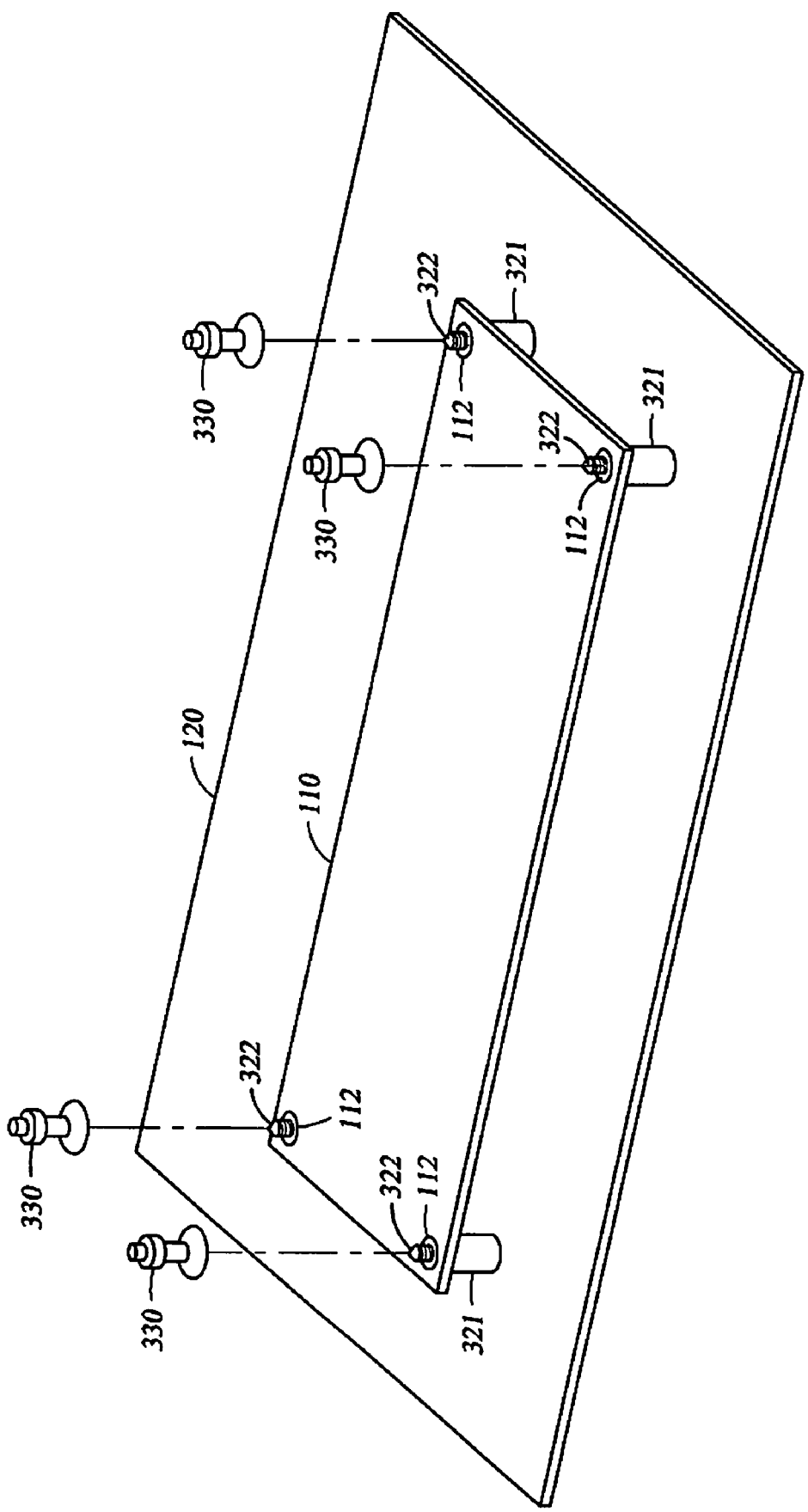
FIG. 3 is an illustration of an exemplary system for securing a PCB to a device chassis, according to an embodiment of the invention.

FIG. 3 illustrates improved standoffs 321 according to an embodiment of the invention. Standoffs 321 are shown securing PCB 110 to a chassis 120. At one end, each standoff 321 may be secured to the device chassis 120, or alternatively, to another component, for example, another PCB. As illustrated in FIG. 3, each standoff 321 may include a securing element 322 (also referred to herein as a "head") to which a retaining member can be attached to secure the PCB 110, as will be described below. The heads 322 may be narrower than the remaining body of standoff 321. Therefore, the PCB may be placed on the standoff so that the heads 322 pass through apertures 112 of PCB 110, as illustrated in FIG. 3. By providing heads that easily pass through associated apertures alignment of the PCB on the chassis can be done quickly and efficiently.

While circular apertures and cylindrical heads are disclosed herein, one skilled in the art will nevertheless recognize that embodiments of the invention are not limited by the cylindrical shape of the heads or apertures. Any reasonable shape that allows a head of the standoff to slide through an aperture of a PCB and allowing the PCB to rest on the standoff may be used. One skilled in the art will also recognize that any reasonable size of apertures in relation to the heads may be selected to allow the apertures to fit tightly around the head, thereby reducing the lateral movement of the PCB.

The PCB may be secured on the standoffs using standoff caps 330. The standoff caps may be made from a suitable insulator material, for example, polycarbonate material. In one embodiment, standoff caps 330 may be "push-pin" shaped and configured to fit snugly around the portion of heads 322 that protrude from apertures 112, thereby providing a mechanical restraint to secure the PCB to the standoffs. For example an inner surface of the standoff cap may lock with a head at the interface of the inner surface and the head surface, thereby securing the cap to the head. Thus, standoff caps may be easily installed without the use of additional tools or the use of excessive force against the standoffs or the PCB, thereby minimizing the risk of damage to device components.

Figure 4A:
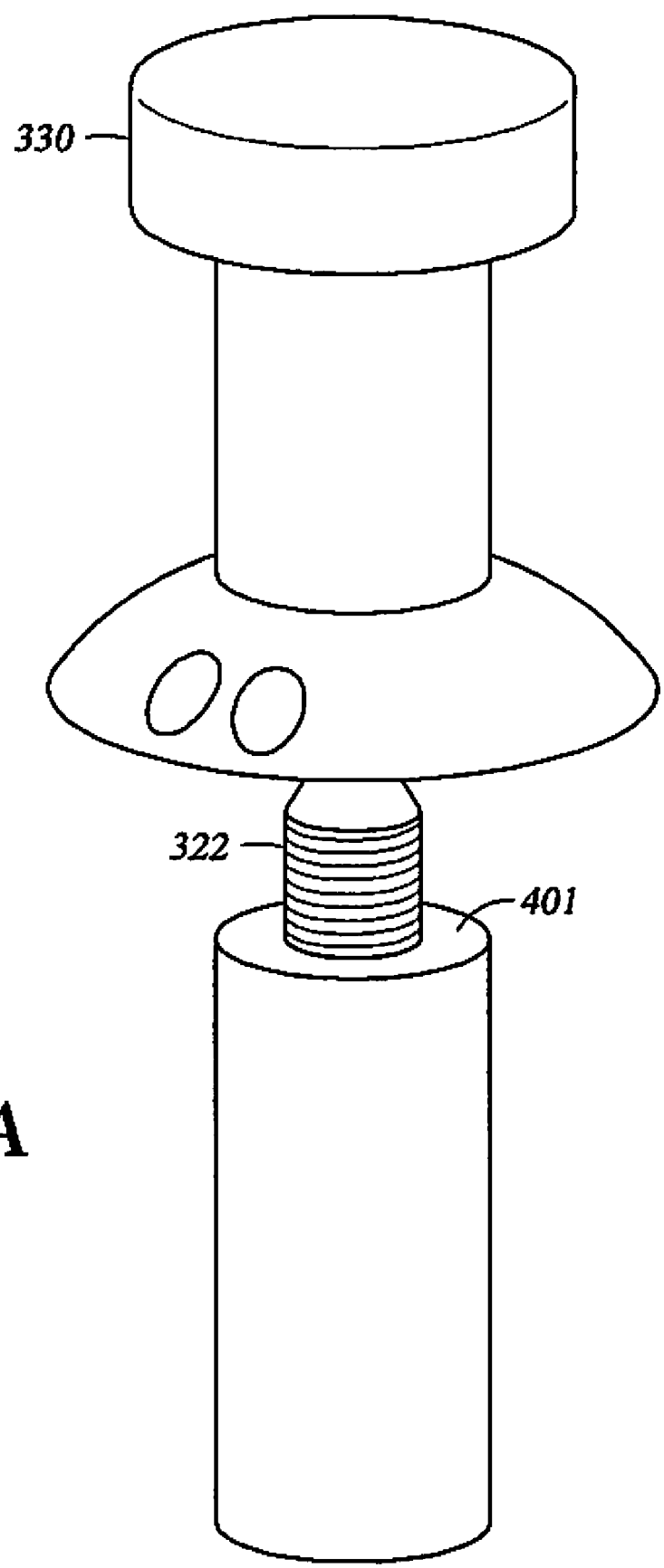
FIG. 4A-4C is an illustration of an exemplary standoff and associated standoff cap according to an embodiment of the invention.

FIG. 4A illustrates an exemplary standoff-standoff cap pair in greater detail. The standoff may consist of a cylindrical body 402, head 322 and a PCB resting surface 401. The standoff may be made of metal, nylon, or some other plastic material. A PCB may be placed on surface 401 of a standoff by passing the head through a PCB aperture 112. Standoff cap 330 may then be secured to the portion of the head protruding from the PCB to mechanically restrain the PCB.

Figure 4B:
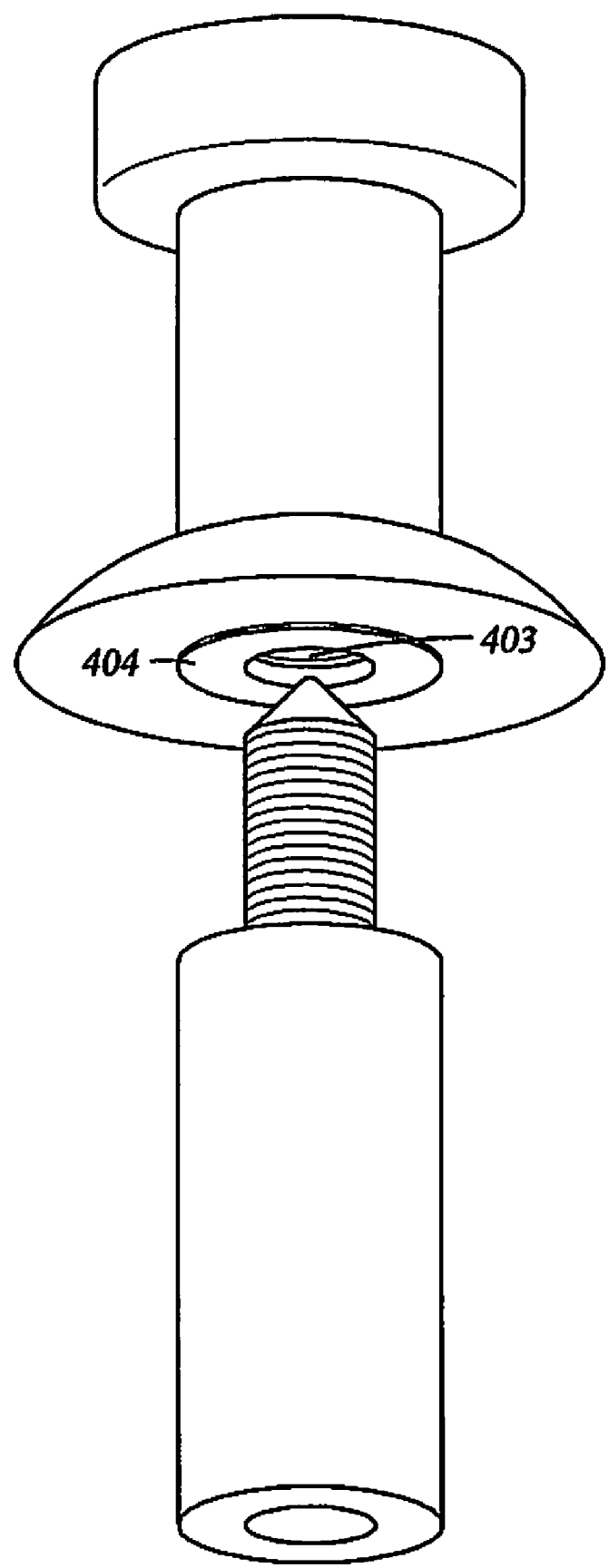

In one embodiment, head 322 may be threaded to allow the standoff cap to be tightly coupled with the head. Accordingly, as illustrated in FIG. 4B, standoff cap 330 may include a threaded hollow sleeve 403 to screw standoff cap 330 to head 332. Furthermore, as illustrated in FIG. 4B, the top of head 322 may be dome or conically shaped, which allows head to be easily guided into the sleeve of the standoff cap. Therefore, standoff caps may be easily installed without the use of additional tools or excessive force. It should be noted that a threaded engagement between the outer surface of the head 322 and the inner surface of the hollow sleeve 403 is merely one embodiment. More generally any kind of interface providing a degree of resistance to relative axial separation is contemplated. For example, the interface may be defined by respective friction surfaces of sufficient roughness.

In some embodiments a gasket 404 may be placed between the standoff cap 330 and a PCB as illustrated in FIG. 4B. Gasket 404 may provide a sound connection between the standoff head and a contact pad on the PCB through the gasket. In one embodiment, the gasket may facilitate the grounding of circuits on the PCB by providing a connection to the chassis through the standoffs. Exemplary gasket materials include rubber and silicone. Conductive gaskets may include impregnated silver in the rubber or silicone to facilitate an electrical connection between a contact pad and the standoff head. However, if circuit isolation is desired, the gasket may be made from a suitable insulator material.

Gasket 404 also fills the space between the PCB and the standoff cap while under compression. Therefore, gasket 404 may be made from a compressible or slightly compressible material so that it tightly fills the space between a standoff cap and PCB, including any irregularities in the alignment between the PCB and the standoff cap. Placing a gasket between the PCB and the standoff cap may also help absorb shocks to the device that may damage the PCB.

Figure 4C:
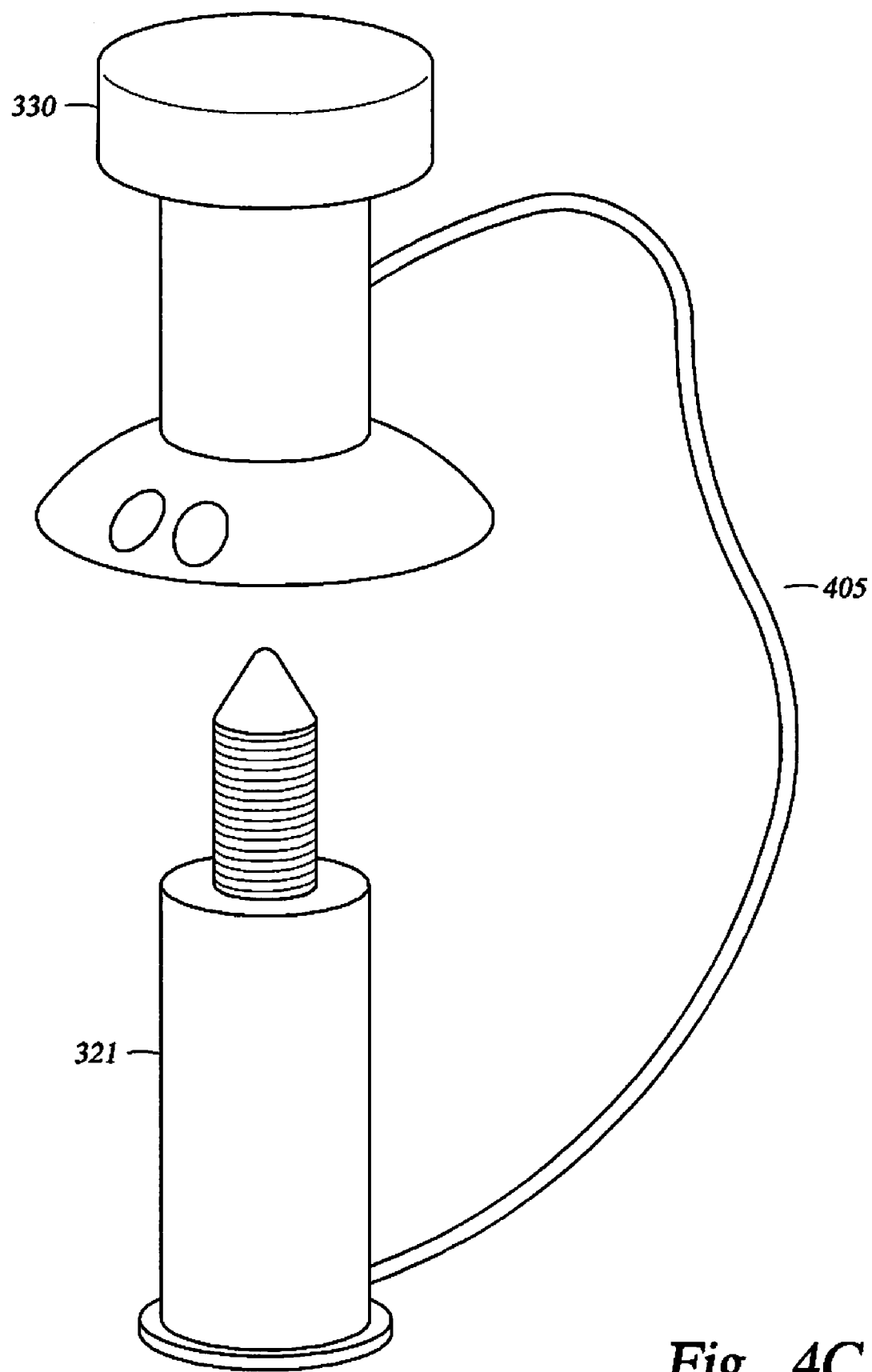

In some embodiments, to prevent the standoff cap from being dropped or lost in the device, each standoff cap may be tethered to an associated standoff using a lanyard 405 as illustrated in FIG. 4C.

Figure 5A:
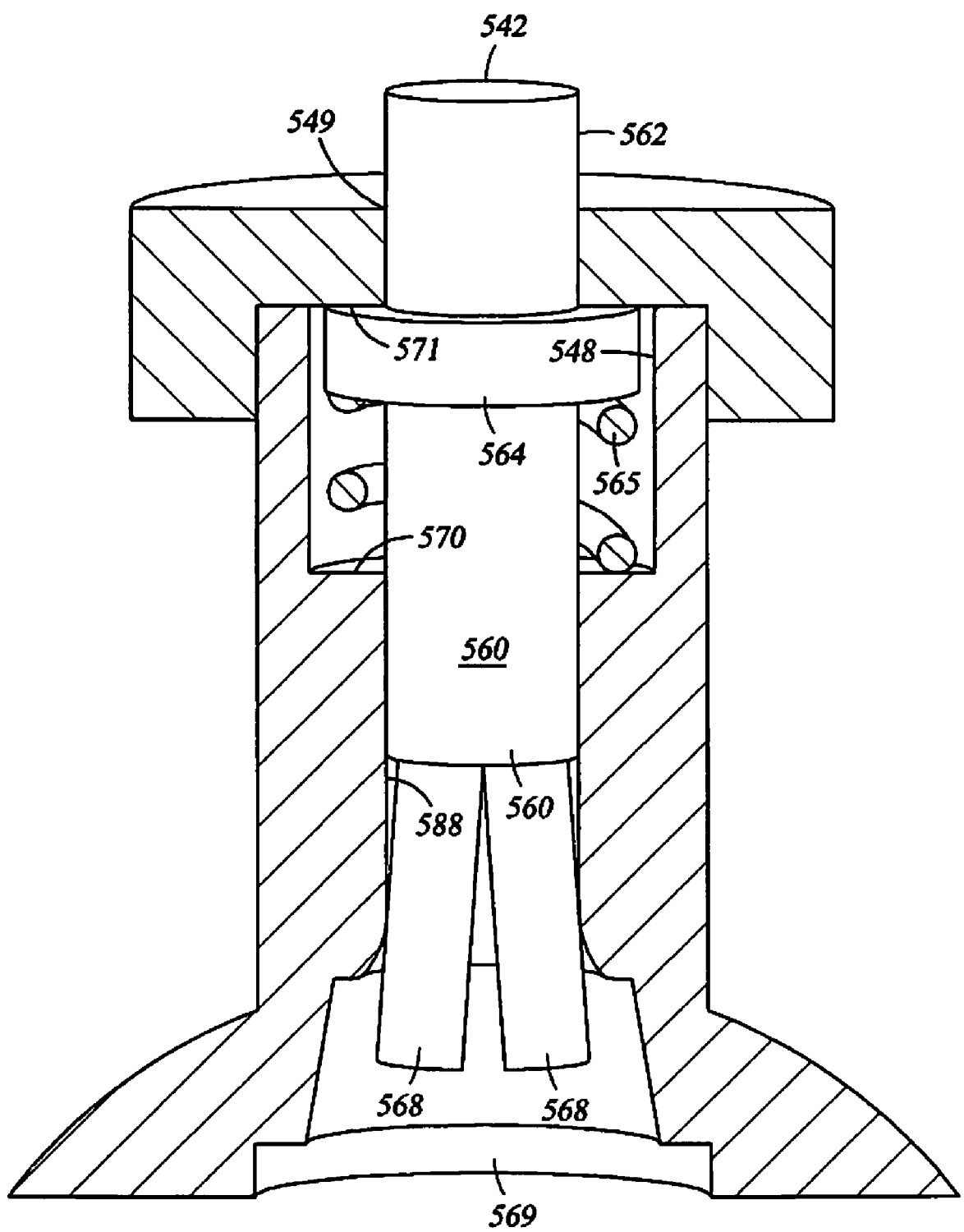
FIG. 5A-5C is an illustration of an exemplary standoff cap according to an embodiment of the invention.
Figure 5B:
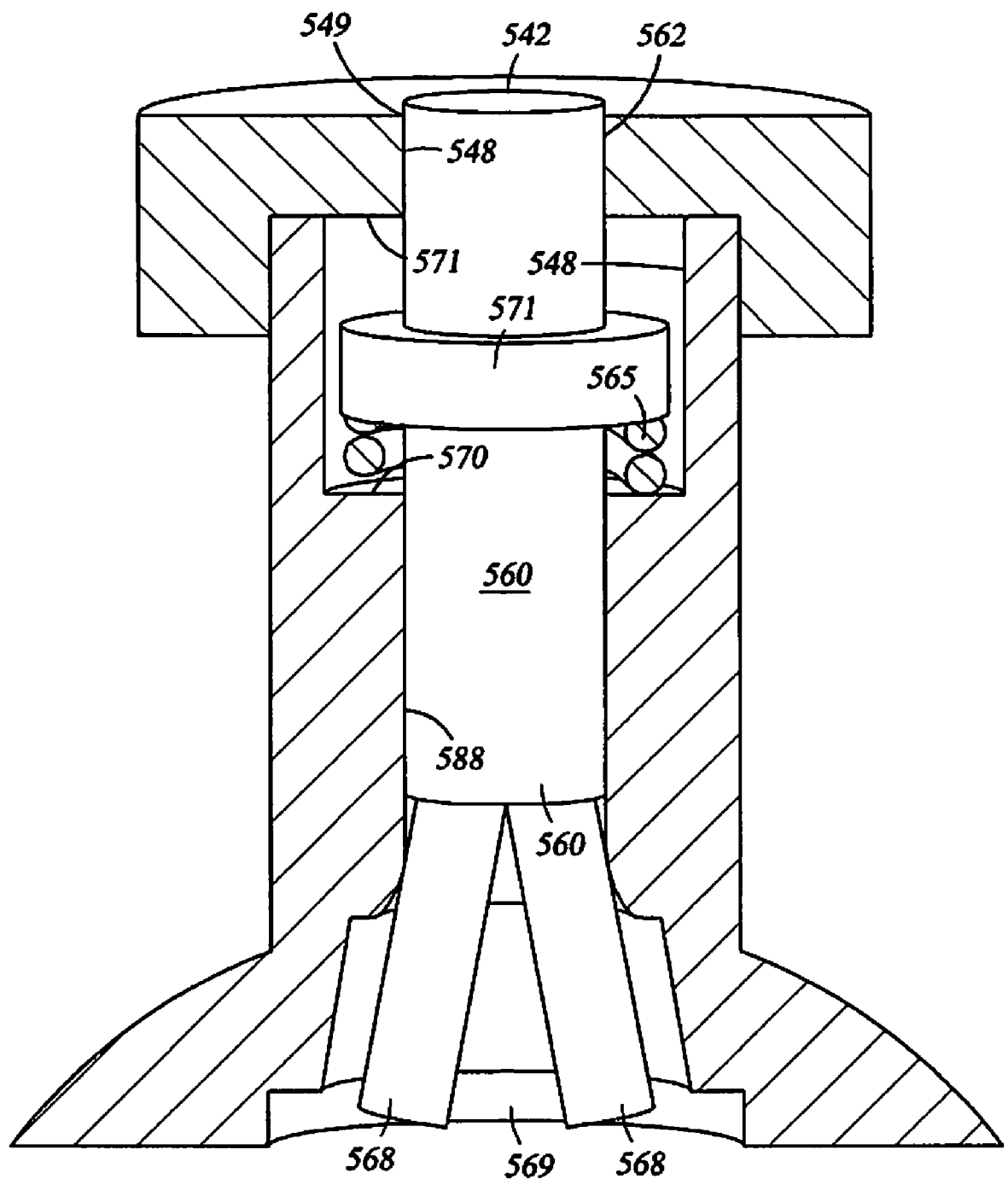
Figure 5C:
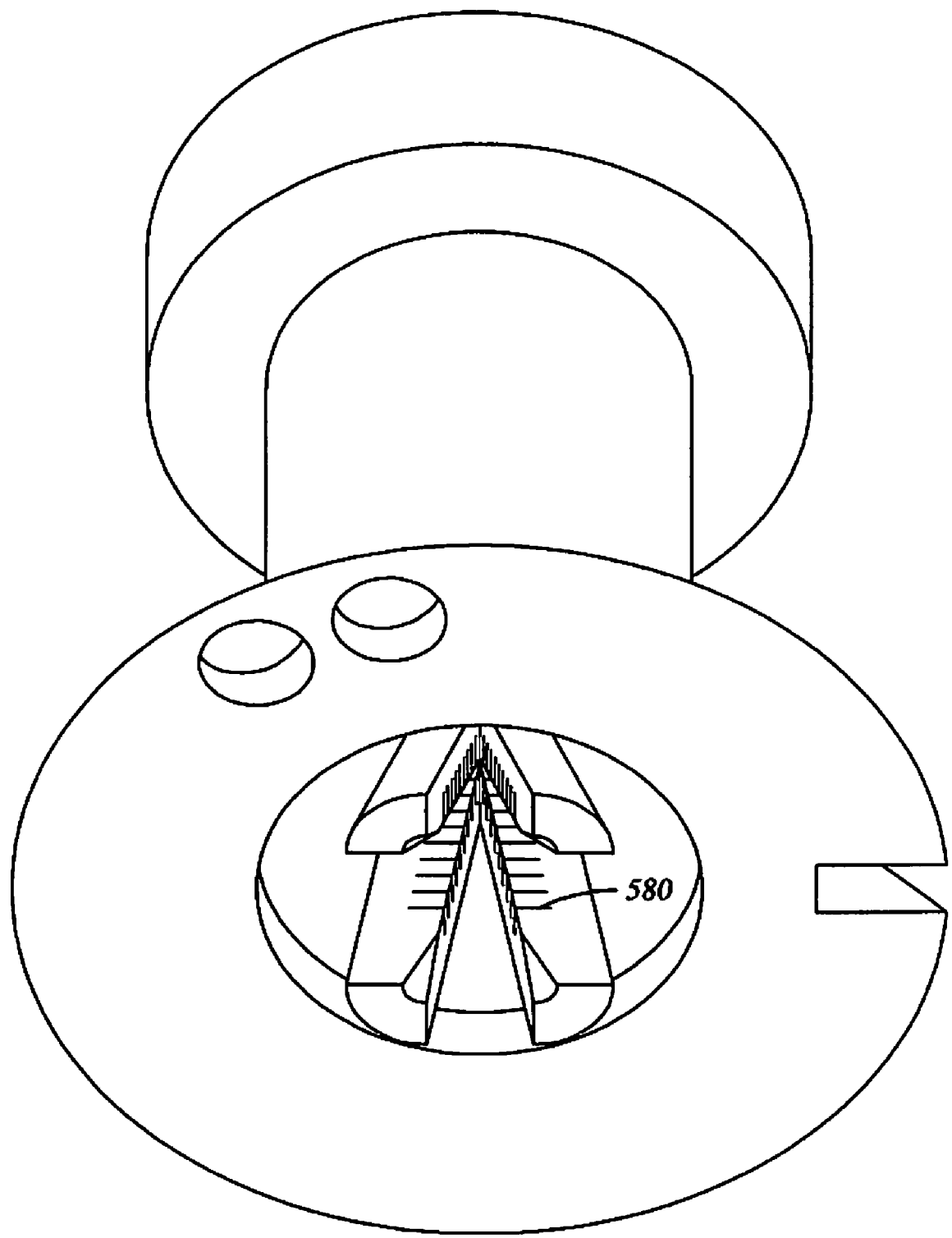

FIGS. 5A-5C illustrate an alternative mechanism to couple standoff cap 330 to head 322. As shown in FIG. 5A, standoff cap 330 may include a coupling mechanism 542 within its housing. Coupling mechanism 542 may include a coupling button 562, actuating body 560, a piston 564, compression spring 565, and an inner surface of the standoff cap defined by a plurality of gripping fingers 568. Coupling button 562 may protrude from a recess 548 in the housing of standoff cap 330, as illustrated in FIG. 5A. Coupling button may be connected to the piston 564 to move piston 564 when the coupling button is pressed.

Piston 564 and compression spring 565 may be contained in a cylindrical chamber 548. Compression spring 565 is placed in the cylinder in such a manner that one end of compression spring 565 is adjacent to piston 564 and the other end is adjacent to a surface 570 of cylindrical chamber 548, as illustrated in FIG. 5A. Compression spring 565 may contain a predetermined amount of tension so that it is biased to push piston 564 to the top end 571 of cylindrical chamber 548.

When button 562 is pressed, piston 564 may move away from top end 571, as illustrated in FIG. 5B. Piston 564 may press against compression spring 565, thereby increasing the tension in compression spring 565. Therefore, when the button is released, spring 565 may push Piston 564 back to top end 571.

Piston 564 may be connected to an actuating body 560. Actuating body 560 may be configured to move along shaft 588 when the button 562 is pressed. Actuating body 560 may be coupled to a plurality of circumferentially arranged gripping fingers 568, as illustrated in FIG. 5.

Gripping fingers 568 may be operatively coupled to button 562 and configured to move in concert with actuating body 560. When button 562 is pressed, gripping fingers 568 may protrude out of opening 569 of the standoff cap and expand outwards as shown in FIG. 5B. Gripping fingers 568 may inherently be biased to flare outwards out of opening 569, into a receiving configuration, when button 562 is pressed. In this open configuration, the fingers define an opening sufficiently large to receive the head. When the button is released, spring 565 may force the fingers back into opening 569, causing the gripping finger to clasp the head.

Gripping fingers 568 may contain ridges 580, as illustrated in FIG. 5C. The ridges are provided to engage the gripping fingers to the threading of a standoff head, thereby locking the standoff cap to the standoff head. To release a locked in standoff cap, button 562 may be pressed, causing the gripping fingers to move further outwards and away from the threaded wall of the standoff head, thereby releasing the standoff cap from the standoff head.

In one embodiment, a member of the cap may press against the head when the button is pressed to urge the head axially away from the cap, thereby facilitating the separation of the cap and the head. For example, when the button 562 is pressed, actuating body 560 may press against the head, thereby allowing the housing of the standoff to move away from the head, thereby facilitating the release of the standoff cap from the head.

Therefore, the standoff caps can easily be installed or removed making PCB installation/removal much more efficient and less tedious. Furthermore, because hardly any downward force is required to install caps with gripping fingers, the risk of damage to the PCB during board installation/removal is also greatly reduced.

PCB Connections and Testing

In one embodiment the standoff 321 may provide an electrically conductive path between the system chassis and the ground plane or ground node on the PCB. A low impedance connection to ground may be essential to the reliability of the PCB. For example, grounding the PCB may reduce electromagnetic interference. To establish a ground connection an aperture representing the ground node may be plated with an electrically conductive material. Therefore, when the standoff head is placed in the aperture a connection is established between the standoff and the ground node.

In some embodiments, in addition to providing support to the PCB, standoff caps may also contain one or more conductive elements which may provide temporary or permanent external electric connections between the PCB and and one or more electric cables. For example, standoff cap 330 may be coupled with a power cable to provide power to components on the PCB. In other implementations, the standoff cap 330 may be coupled with cables configured to carry test signals, signals from other devices, or to probe the PCB. Securing the standoff cap to a standoff head may cause the cables to connect to one or more connector pads on the PCB through the conductive elements, thereby creating a signal path between the cables and the PCB.

Figure 6:
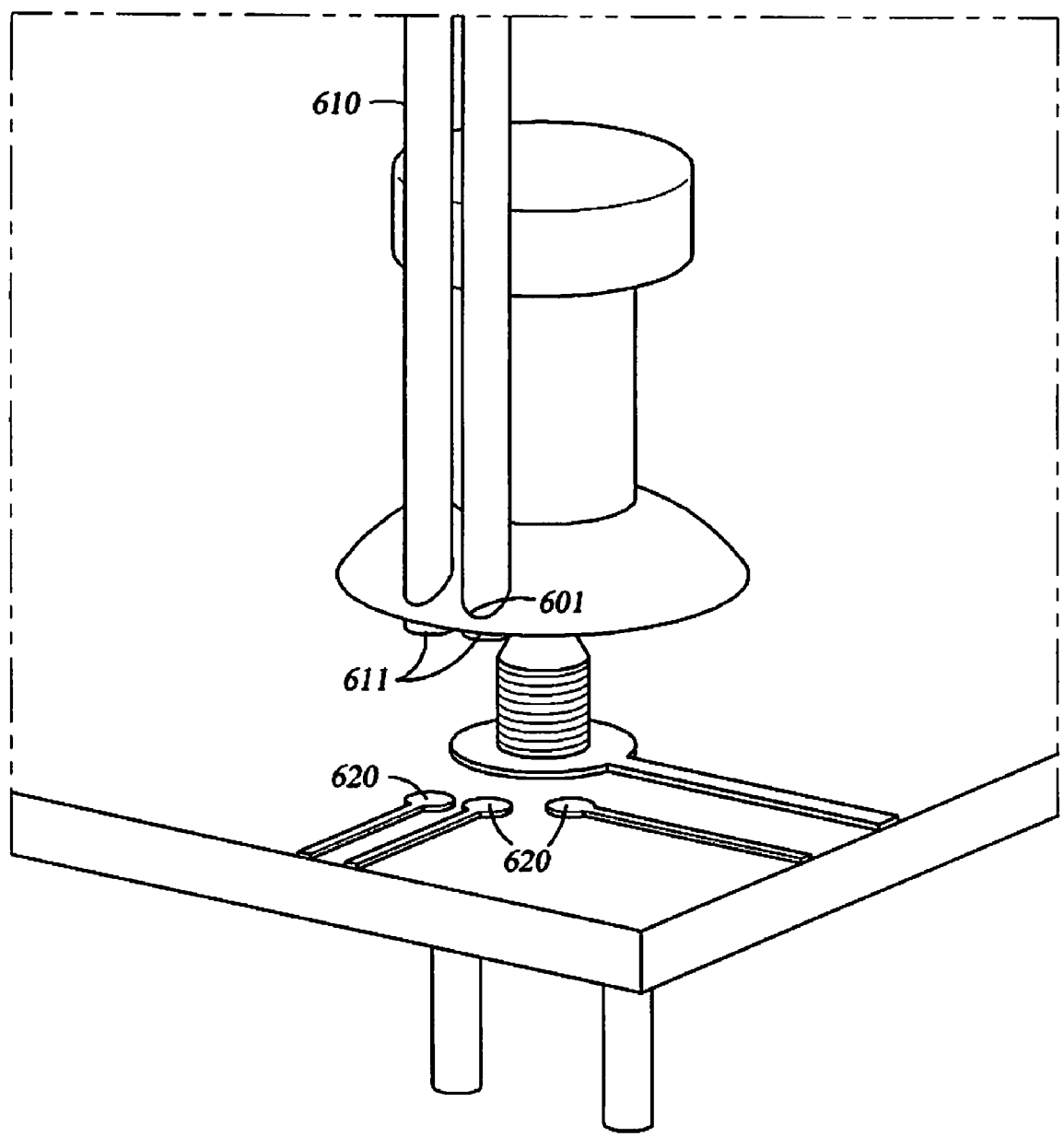
FIG. 6 is an illustration of an exemplary standoff cap coupled with electric cables, according to an embodiment of the invention.

FIG. 6 illustrates an exemplary implementation of a standoff cap 330 configured to provide external signals to the PCB. As illustrated in FIG. 6, standoff cap 330 may contain one or more through holes 601 in the flared bottom portion of the cap. Through hole 601 may carry a cable 610 as illustrated. Cable 610 may contain a prong 611 that protrudes from the bottom of the standoff cap, as shown in FIG. 6. Prong 611 may be configured to contact a connector pad 620 of the PCB. As illustrated, a plurality of connector pads 620 is provided. The signals carried on cable 610 may be provided to any pad by simply twisting the standoff cap so that prong 611 connects to the desired pad.

The above mentioned system for providing external signals to the PCB achieves several advantages over the prior art. For example, prior art requires a separate connector to be placed on the PCB for each test that was to be performed, thereby taking up valuable space on the PCB. Embodiments of the invention obviate the prior art requirement of placing multiple connectors by providing multiple connector pads around the same standoff head to conserve space. Different test signals may then be provided to the PCB by placing a standoff cap with a cable containing the desired test signal in such a way that the cable makes contact with the appropriate connector pad.

For example, during a first test, cable 610 may be connected to a voltage source to provide a predetermined voltage to the PCB. Standoff cap 330 may then be connected to the head 322 and twisted so that prong 611 connects to a first connector pad. Standoff cap 330 may be removed after the first test. Subsequently, during a second test, cable 610 may be connected to a current source to provide a predetermined current to the PCB. Standoff cap 330 may be connected to the same head 322 and twisted so that prong 611 connects to a second connector pad. This step may be similarly repeated for multiple signals being provided to multiple connector pads. Therefore, valuable real estate on the PCB may be saved by avoiding multiple connectors A further advantage of the standoff caps described in FIG. 6 is that the standoff caps need not be left on the PCB post testing, thereby making it reusable. Because standoff caps containing gripping fingers can easily be installed and removed, the same standoff cap may be used to test multiple boards. This results in significant cost savings over the prior art where potentially gold plated connectors had to be left on the PCB post testing.

In some embodiments, after a standoff cap that is coupled with one or more test cables and used for PCB testing is removed from a given head, a retaining standoff cap (without cables) may be placed on the head. The placement of such a retaining standoff cap may aid in securing the PCB to the standoffs.

While a single cable is shown coupled with the standoff cap in FIG. 6, one skilled in the art will nevertheless realize that multiple cables may be coupled with a standoff cap. One or more cables coupled with the standoff cap may be configured to connect to one or more connector pads, thereby allowing simultaneous imposition of multiple signals and/or parallel testing.

During testing, the standoff cap may twist due to a number of reasons, causing the connection between prong 611 and a particular connector pad to be lost. For example, moving a cable coupled to the standoff cap may cause the standoff cap to twist, resulting in a loss of connection between the cable and the PCB. To prevent such undesired twisting, the standoff cap may be locked in a particular position using a key.

Figure 7:
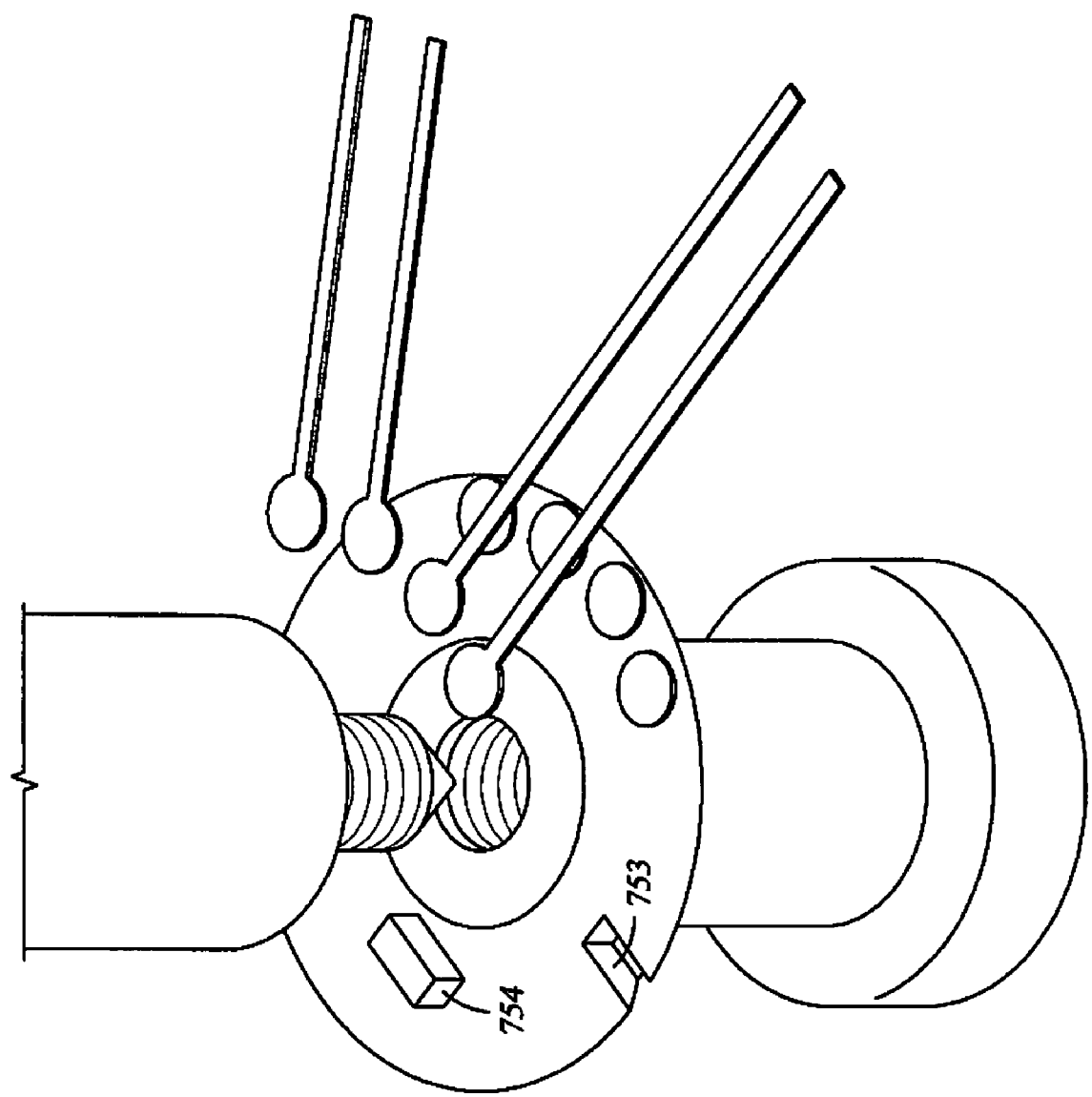
FIG. 7 is an illustration of an exemplary standoff cap containing a keying mechanism, according to an embodiment of the invention.

Referring back to FIG. 5C, a slot 553 may be provided in the flared portion of the standoff cap to lock the standoff cap with a protrusion on the PCB. Slot 553 may wrap around a protrusion on the PCB, thereby preventing twisting of the standoff cap. Alternatively a protrusion may be provided in the standoff cap that locks the stand off cap by sliding into a slot on the PCB. FIG. 7 illustrates a standoff cap containing slot 753 and a protrusion 754 for locking the cap. When multiple connector pads may be accessed by the standoff cap, the particular keying position may identify the pad, thereby facilitating the coupling of the cable to a particular pad.

Figure 8:
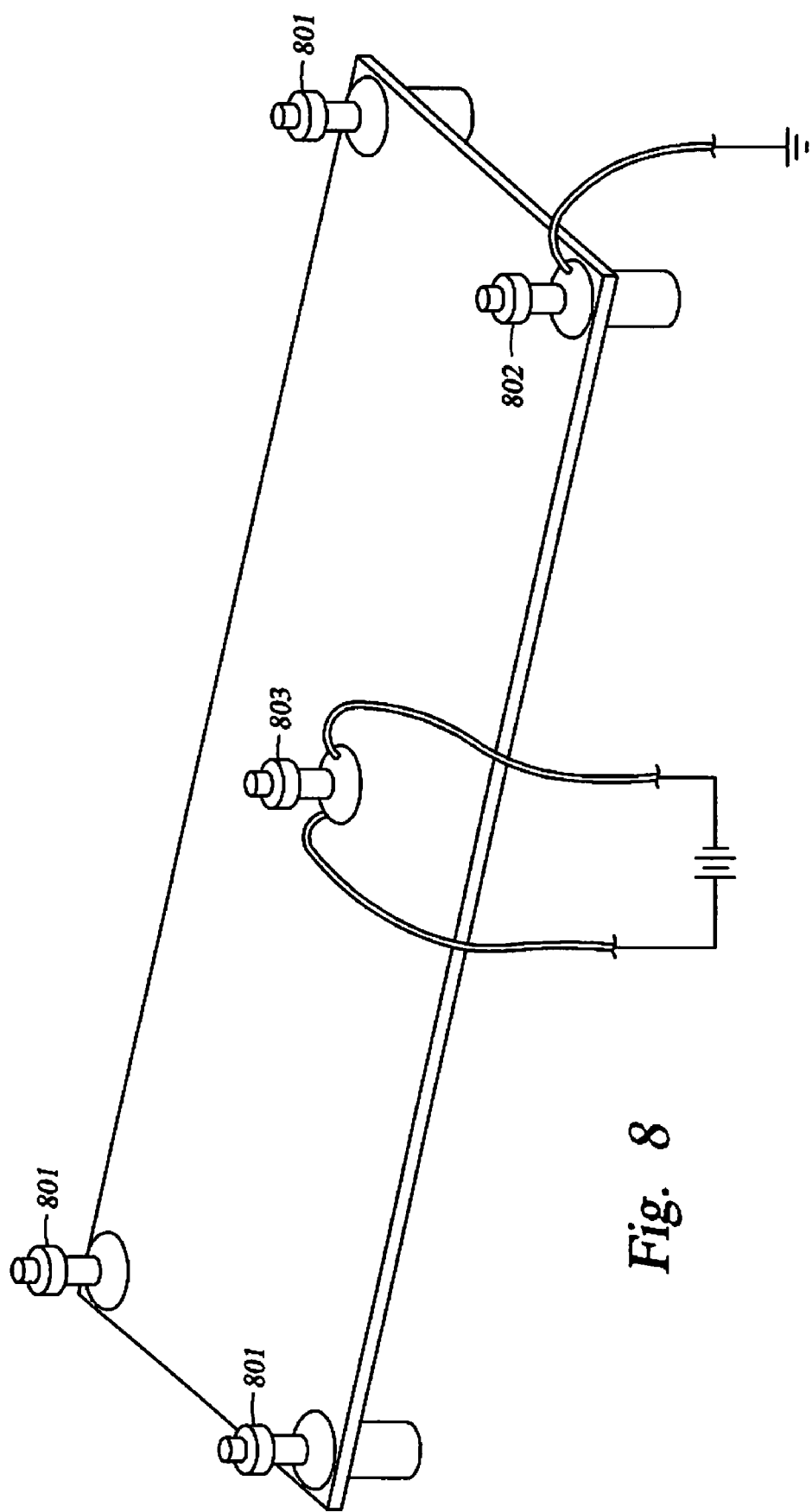
FIG. 8 is an illustration of a system comprising a plurality of color coded standoff caps, according to an embodiment of the invention.

In some embodiments, the standoff caps may be color coded to identify a function of the standoff cap. Exemplary standoff cap functions include PCB retention, testing, and power supply. FIG. 8 illustrates a plurality of standoff caps coupled to a PCB 110. Standoff caps 801 may be used for mechanically restraining the PCB to the standoffs. Accordingly, standoff caps 801 may all be of the same color, for example, black. Standoff cap 802 may be coupled with a power supply supplying power to PCB components. Standoff caps coupled with power supplies may be of a unique color, for example, red. Standoff cap 803 may provide test signals to the PCB, and may be a separate color, for example blue. Standoff cap colors may also be used to differentiate between different testing functions.

Conclusion

The improved standoff system described herein allows faster and more efficient alignment of PCBs during installation. Furthermore, by utilizing push pin type standoff caps to secure the PCB, the use of additional tools and excessive forces to install the PCB is avoided. Therefore, installation of PCBs is accomplished faster and with little effort. Moreover, the risk of damage to device components is also greatly reduced.

Standoff caps may also be used to provide power and test signals to the PCB by coupling the standoff caps with an electric cable providing the signals. Each standoff cap may connect to different connector pads on the PCB to provide an appropriate signal to the pad. Furthermore, because standoff caps are easily removable, they need not be left on the board, and may be used to test multiple boards. Therefore, the prior art cost of leaving connectors on the PCB is also obviated.

While the foregoing is directed to embodiments of the present invention, other and further embodiments of the invention may be devised without departing from the basic scope thereof, and the scope thereof is determined by the claims that follow.

What is claimed is:

1. A mounting device for mounting a printed circuit board (PCB), comprising:
    a standoff comprising a body and a securing element disposed in and protruding from the body, wherein the body forms a PCB resting surface at an interface of the securing element and the body and wherien the securing element is configured to be registered with and disposed through an aperture formed in the PCB; and
    a standoff cap comprising a hollow sleeve configured to axially receive the securing element and a coupling mechanism comprising a button and gripping fingers operatively coupled to the button, wherein, when the button is pressed, the gripping fingers are flared outwardly into a receiving configuration and when the button is released the gripping fingers are biased inwardly into a retaining configuration in which the gripping fingers grip the securing member and mechanically restrain the PCB against the PCB resting surface of the standoff.

2. The mounting device of claim 1, wherein the securing element is a threaded member.

3. The mounting device of claim 1, wherein the standoff cap is tethered to the standoff.

4. The mounting device of claim 1, further comprising a gasket placed between the PCB and the standoff cap.

5. The mounting device of claim 1, wherein the gripping fingers are concentrically arranged in the hollow sleeve.

6. The mounting device of claim 1, each gripping finger comprises ridges configured to lock against a surface of the securing element.

7. The mounting device of claim 1, wherein the standoff cap comprises one or more electrically conductive elements configured to electrically connect to one or more connector pads formed on the PCB thereby defining one or more signal paths between the standoff cap and the PCB.

8. The mounting device of claim 7, wherein the standoff cap comprises a slot configured to register with a protruding key formed on the PCB to lock the standoff cap in a predetermined position and prevent the standoff cap from rotating.

9. The mounting device of claim 1, wherein the standoff cap comprises a plurality of electrically conductive elements configured to electrically connect to respective connector pads formed on the PCB thereby defining one or more discrete signal paths between the standoff cap and the PCB for different signals.

10. A device, comprising:
   a plurality of standoffs connected to one of a device chassis and a device component, the standoffs each comprising a body and a securing element disposed in and protuding from the body, wherein the body forms a PCB resting surface at an interface of the securing element and the body;
   a printed circuit board (PCB) disposed on the respective PCB resting surface of the standoffs and wherein the PCB defines a plurality of apertures each having a respective one of the securing elements of the standoffs disposed therethrough; and
   a plurality of standoff caps, each comprising a hollow sleeve and a coupling mechanism comprising a button and gripping fingers operatively coupled to the button, wherein, when the button is pressed, the gripping fingers flare outwardly into a receiving configuration and when the button is released the gripping fingers are biased inwardly into a retaining configuration in which the gripping fingers grip a respective securing element and mechanically restrain the PCB against the standoff, wherein the standoff caps are color coded, each color identifying a function of the standoff caps.

11. The device of claim 10, wherein the standoff cap comprises a plurality of electrically conductive elements configured to electrically connect to respective connector pads formed on the PCB thereby defining one or more discrete signal paths between the standoff cap and the PCB for different signals.

12. The device of claim 10, the functions comprise:
   supplying power to the PCB;
   probing the PCB;
   supplying one or more test signals to the PCB; and
   securing the PCB.

13. The device of claim 10, wherein the securing element is a threaded member.

14. The device of claim 10, wherein the standoff caps are tethered to respective standoffs.

15. The device of claim 10, wherein the gripping fingers are concentrically arranged in the hollow sleeve.

16. The device of claim 10, wherein each gripping finger comprises ridges configured to lock against a surface of the securing element.

17. The device of claim 10, wherein one or more standoffs comprise a slot configured to register with a protruding key formed on the PCB to lock the standoff cap in a predetermined position and prevent the standoff cap from rotating.

18. The device of claim 10, further comprising one or more gaskets placed between the PCB and a respective standoff.

* * * * *